United States Patent
Haines et al.

(10) Patent No.: US 11,635,474 B2
(45) Date of Patent: Apr. 25, 2023

(54) FREQUENCY DEPENDENT GROUND FAULT INTERRUPT

(71) Applicant: Pass & Seymour, Inc., Syraucse, NY (US)

(72) Inventors: Joshua P. Haines, Marcellus, NY (US); Michael F. McMahon, Syracuse, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 0 days.

(21) Appl. No.: 17/038,302

(22) Filed: Sep. 30, 2020

(65) Prior Publication Data
US 2021/0096192 A1   Apr. 1, 2021

Related U.S. Application Data

(60) Provisional application No. 63/058,210, filed on Jul. 29, 2020, provisional application No. 62/908,110, filed on Sep. 30, 2019.

(51) Int. Cl.
*G01R 31/52* (2020.01)
*G01R 31/58* (2020.01)
*G01R 31/66* (2020.01)

(52) U.S. Cl.
CPC ............. *G01R 31/52* (2020.01); *G01R 31/58* (2020.01); *G01R 31/66* (2020.01)

(58) Field of Classification Search
CPC ........ G01R 31/52; G01R 31/50; G01R 31/54; G01R 31/55; G01R 31/56; G01R 31/58
See application file for complete search history.

(56) References Cited

U.S. PATENT DOCUMENTS

| | | | | |
|---|---|---|---|---|
| 7,154,718 B1 * | 12/2006 | Finlay, Sr | ............... | H01H 83/04 361/42 |
| 7,298,598 B1 * | 11/2007 | Morgan | ................. | H02H 3/338 324/424 |
| 2009/0284880 A1 * | 11/2009 | Radosavljevic | ....... | H01H 71/20 361/45 |

(Continued)

FOREIGN PATENT DOCUMENTS

| CA | 2623718 A1 * | 4/2007 | ............. H02H 7/261 |
|---|---|---|---|
| CN | 201594727 U * | 9/2010 | |

(Continued)

*Primary Examiner* — Patrick Assouad
*Assistant Examiner* — Demetrius R Pretlow
(74) *Attorney, Agent, or Firm* — Bond, Schoeneck & King, PLLC

(57) ABSTRACT

An electrical wiring device including: a plurality of line terminals comprising a line-side phase terminal and a line-side neutral terminal; a plurality of load terminals comprising a load-side phase terminal and a load-side neutral terminal; a line conductor electrically coupling the line-side phase terminal to the load-side phase terminal; a neutral conductor electrically coupling the line-side neutral terminal to the load-side neutral terminal; and a controller configured to trigger a trip mechanism to electrically decouple the at least one of the plurality of line terminals from at least one of the plurality of load terminals based, at least in part, on comparing a magnitude of the current differential to a threshold, wherein the threshold is a function of the frequency of the current differential.

24 Claims, 13 Drawing Sheets

(56) References Cited

U.S. PATENT DOCUMENTS

| | | | |
|---|---|---|---|
| 2010/0053826 A1* | 3/2010 | Finlay, Sr | H02H 3/338 361/42 |
| 2011/0148423 A1* | 6/2011 | Richards | G01R 31/28 324/424 |
| 2011/0216451 A1* | 9/2011 | Haines | B60L 53/16 361/42 |
| 2011/0216453 A1* | 9/2011 | Haines | H02H 9/00 361/49 |
| 2011/0242711 A1* | 10/2011 | Morgan | H01H 83/144 361/42 |
| 2011/0261490 A1* | 10/2011 | Weeks | H01H 83/04 361/63 |
| 2012/0154972 A1* | 6/2012 | McMahon | H02H 3/162 361/187 |
| 2013/0057990 A1* | 3/2013 | Finlay, Sr | H02H 3/338 361/50 |
| 2013/0128396 A1* | 5/2013 | Danesh | G01R 23/02 361/45 |
| 2013/0335866 A1* | 12/2013 | McMahon | H02H 3/338 361/42 |
| 2014/0218044 A1* | 8/2014 | Ostrovsky | H02H 3/16 324/509 |
| 2014/0254050 A1* | 9/2014 | Haines | H02H 3/16 361/42 |
| 2014/0268436 A1* | 9/2014 | Du | H02H 11/002 361/42 |
| 2017/0373681 A1* | 12/2017 | Masten, Jr. | H02H 3/044 |
| 2018/0076616 A1* | 3/2018 | Thrush | H01H 83/144 |
| 2019/0128941 A1* | 5/2019 | Beck | H02H 3/33 |
| 2020/0003820 A1* | 1/2020 | Fukudome | G01R 31/52 |
| 2020/0161849 A1 | 5/2020 | Batko et al. | |

FOREIGN PATENT DOCUMENTS

| | | | | |
|---|---|---|---|---|
| CN | 201797291 U | * | 4/2011 | H02H 1/003 |
| CN | 202586188 U | * | 12/2012 | H02H 7/261 |
| GB | 2124391 A | * | 2/1984 | H02H 1/003 |

* cited by examiner

FREQUENCY DEPENDENT GROUND FAULT INTERRUPT

CROSS REFERENCE TO RELATED APPLICATIONS

The present application claims priority to and the benefit of U.S. Provisional Patent Application No. 62/908,110 filed on Sep. 30, 2019 and U.S. Provisional Patent Application No. 63/058,210 filed on Jul. 29, 2020, the entireties of which are incorporated herein by reference.

BACKGROUND OF THE INVENTION

1. Field of the Invention

The present invention relates to wiring devices and, more specifically, to a frequency dependent ground fault interrupt wiring device.

2. Description of the Related Art

A Ground Fault Circuit Interrupt (GFCI) is an electrical wiring device that shuts off electrical power by "tripping" when it detects a current imbalance between a line wire and a neutral wire exceeding a safety threshold. The primary purpose of a GFCI is to prevent electrocution in a human bystander, as an imbalance between the line and neutral could be indicative of a dangerous short circuit. However, as described by Charles F Dalziel in 1971, the human body's response to current flow changes as current flow frequency increases. More specifically, the human muscle responds more acutely to low-frequency current than to high-frequency current. GFCI circuits that do not account for this frequency-dependent current threshold variation can trip when sensing harmless high frequency current imbalances, unnecessarily disrupting the electrical system under its protection. Such unnecessary trips are known as "nuisance trips," since they present a nuisance to a user that must now reset the electrical wiring device in response to an event that did not present a hazard to the user's health. Accordingly, there is a critical need for a frequency-dependent GFCI circuit configured to prevent unnecessary trips in response to high-frequency faults while still protecting users from dangerous current imbalances.

BRIEF SUMMARY OF THE INVENTION

According to an aspect, an electrical wiring device includes a plurality of line terminals comprising a line-side phase terminal and a line-side neutral terminal; a plurality of load terminals comprising a load-side phase terminal and a load-side neutral terminal; a line conductor electrically coupling the line-side phase terminal to the load-side phase terminal; a neutral conductor electrically coupling the line-side neutral terminal to the load-side neutral terminal; and a controller configured to trigger a trip mechanism to electrically decouple the at least one of the plurality of line terminals from at least one of the plurality of load terminals based, at least in part, on comparing a magnitude of a current differential to a threshold, wherein the current differential represents a difference in current between the line conductor and the neutral conductor, wherein the threshold is a function of a frequency of the current differential.

In an example, the threshold is retrieved from a plurality of stored thresholds according to a frequency value of the differential current, each of the stored thresholds being respectively associated with a range of frequency values of the differential current.

In an example, wherein the controller is further configured to determine a frequency value of the differential current.

In an example, the controller determines the frequency value of the differential current according to a number of instances the current differential exceeds a frequency value over a predetermined period of time.

In an example, the controller receives a voltage signal representative of the magnitude of the current differential, wherein the controller compares the magnitude of the current differential to the threshold by comparing the voltage signal representative of the magnitude of the current differential to the threshold.

In an example, the voltage signal, received by the controller, is generated by a differential transformer through which the line conductor and the neutral conductor extend.

In an example, the input voltage is amplified by an amplifier.

In an example, the input voltage is further filtered by a low pass filter.

In an example, the input voltage is amplified and filtered by a transimpedance amplifier.

In an example, the controller comprises a comparator, the comparator comparing a magnitude of the differential current to a threshold, wherein the threshold is a smoothed pulse width modulated signal, a pulse width of the pulse width modulated being determined according to a frequency value of the current differential.

In an example, the pulse width modulated signal is smoothed with a smoothing capacitor.

In an example, the controller is further configured to generate the pulse width modulated signal.

In an example, the electrical wiring device further includes a controller integrity detection circuit configured to trigger the trip mechanism if an input signal is not received from the controller within a predetermined period of time.

In an example, the electrical wiring device further includes a function generator configured to provide a drive signal to a third conductor, wherein at least the neutral conductor and the third conductor extend through a differential transformer, wherein the drive signal creates a differential current in the third conductor with respect to the neutral conductor.

According to another aspect, an electrical wiring device, includes a plurality of line terminals comprising a line-side phase terminal and a line-side neutral terminal; a plurality of load terminals comprising a load-side phase terminal and a load-side neutral terminal; a line conductor electrically coupling the line-side phase terminal to the load-side phase terminal; a neutral conductor electrically coupling the line-side neutral terminal to the load-side neutral terminal; and a controller configured to trigger a trip mechanism to electrically decouple the at least one of the plurality of line terminals from at least one of the plurality of load terminals based, at least in part, on comparing a magnitude of the current differential to a threshold, a controller integrity detection circuit configured to trigger the trip mechanism if an input signal is not received from the controller within a predetermined period of time.

In an example, the controller is configured to perform at least one test prior to outputting the input signal to the controller integrity detection circuit.

In an example, the at least one test comprises a grounded neutral test.

In an example, the at least one test is a test of a hardware, a firmware, or a software of the controller.

In an example, the integrity detection circuit comprises an inverter and a capacitor, the capacitor being connected across the input of the inverter, wherein the input signal charges the capacitor such that the output of the inverter to the trip mechanism is LOW.

In an example, the electrical wiring device further includes a second capacitor connected in series with the input of the inverter.

In an example, an electrical wiring device includes a plurality of line terminals comprising a line-side phase terminal and a line-side neutral terminal; a plurality of load terminals comprising a load-side phase terminal and a load-side neutral terminal; a line conductor electrically coupling the line-side phase terminal to the load-side phase terminal; a neutral conductor electrically coupling the line-side neutral terminal to the load-side neutral terminal; and a third conductor; differential transformer, wherein at least the neutral conductor and the third conductor extend through an inner diameter of the differential transformer; a function generator configured to provide a drive signal to the third conductor, wherein the drive signal creates a differential current in the third conductor with respect to the neutral conductor, wherein the differential transformer is configured to generate a voltage signal representative of the differential current; a protective circuit assembly coupled to the differential transformer, the protective circuit assembly being configured to trigger a trip mechanism to electrically decouple at least one of the plurality of line terminals from at least one of the plurality of load terminals when the voltage signal substantially corresponds to at least one predetermined fault criterion, wherein the drive signal is configured to create the differential current in a manner that matches at least one of the at least one predetermined fault criterion.

In an example, the differential current, created by the drive signal, is of a non-standard frequency.

In an example, the differential current, created by the drive signal, comprises a non-standard shape.

In an example, the drive signal is swept over a range of frequencies, an upper bound of the range of frequencies exceeding 60 Hz.

In an example, the protective circuit assembly comprises a controller configured to trigger the trip mechanism to electrically decouple the at least one of the plurality of line terminals from at least one of the plurality of load terminals based, at least in part, on comparing a magnitude of the current differential to a threshold, wherein the threshold is a function of the frequency of the current differential.

In an example, the protective circuit assembly comprises a ground fault circuit interrupt controller.

In an example, the third conductor includes at least one resistor, the application of the drive signal to the at least one resistor creating the differential current.

BRIEF DESCRIPTION OF THE SEVERAL VIEWS OF THE DRAWING(S)

The present invention will be more fully understood and appreciated by reading the following Detailed Description in conjunction with the accompanying drawings, in which.

DETAILED DESCRIPTION OF THE INVENTION

Figure 1A:
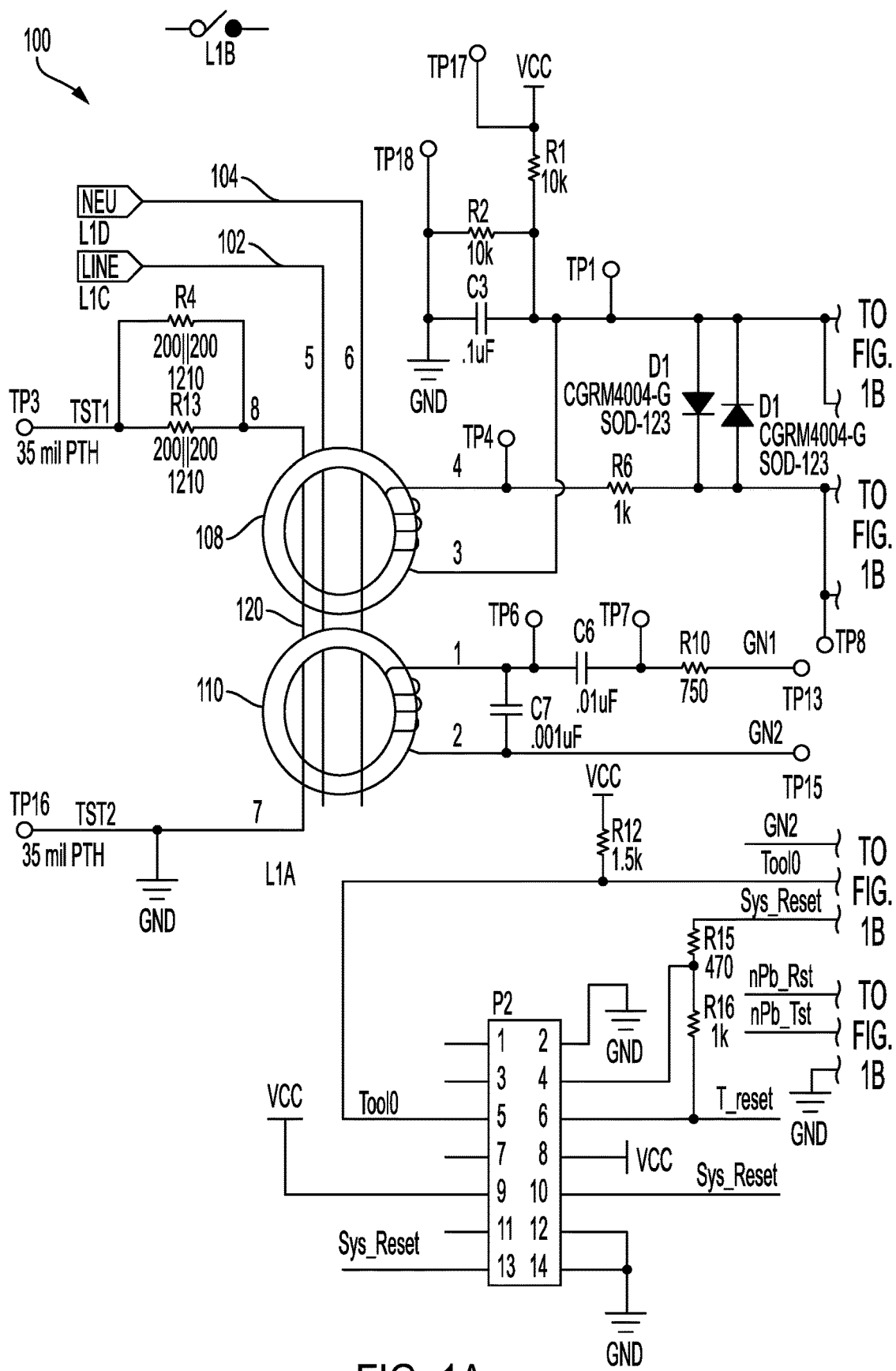
FIG. 1A is a part of a schematic of a frequency dependent ground fault interrupt circuit, according to an example.
Figure 1B:
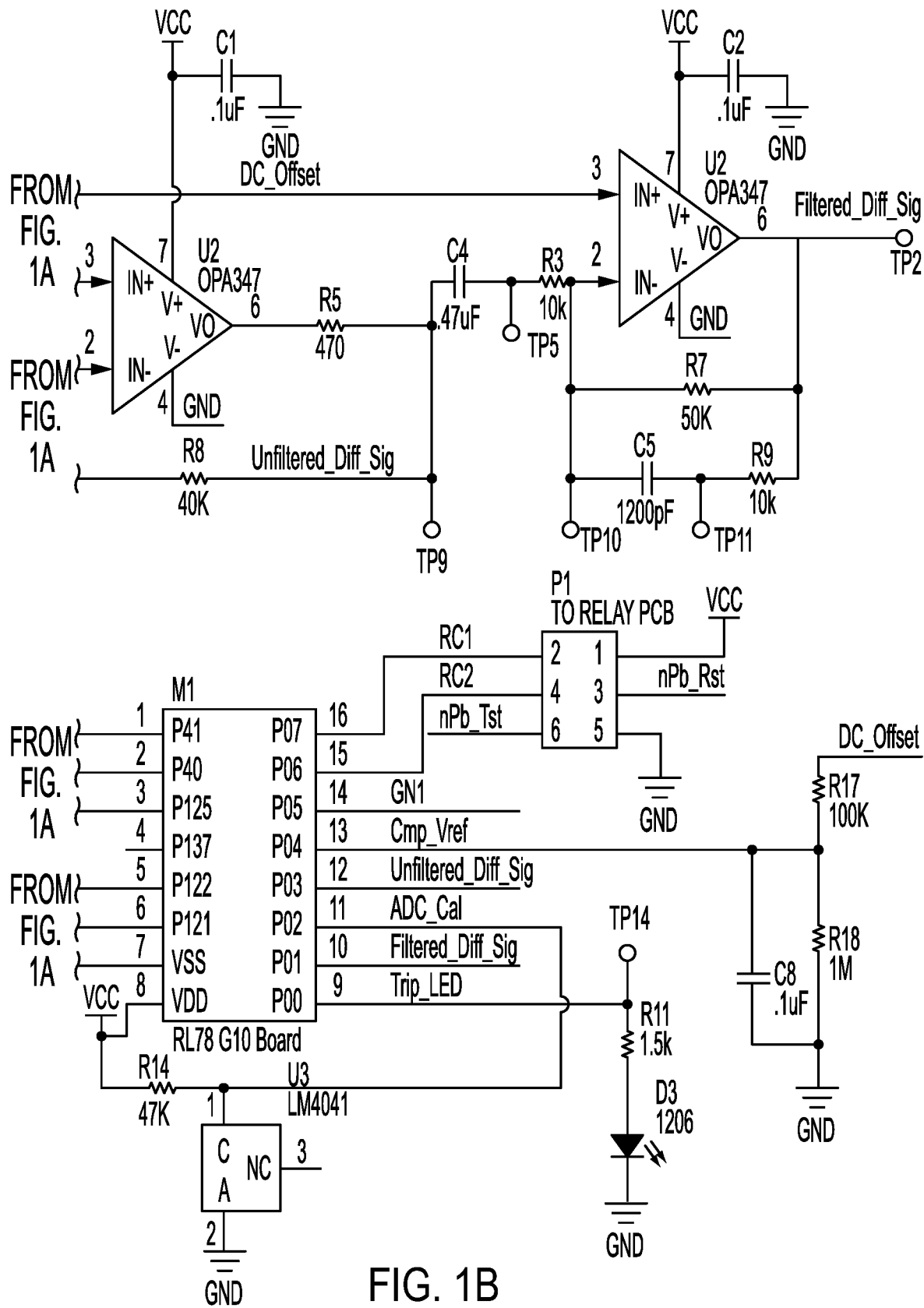
FIG. 1B is a part of a schematic of a frequency dependent ground fault interrupt circuit, according to an example.
Figure 7A:
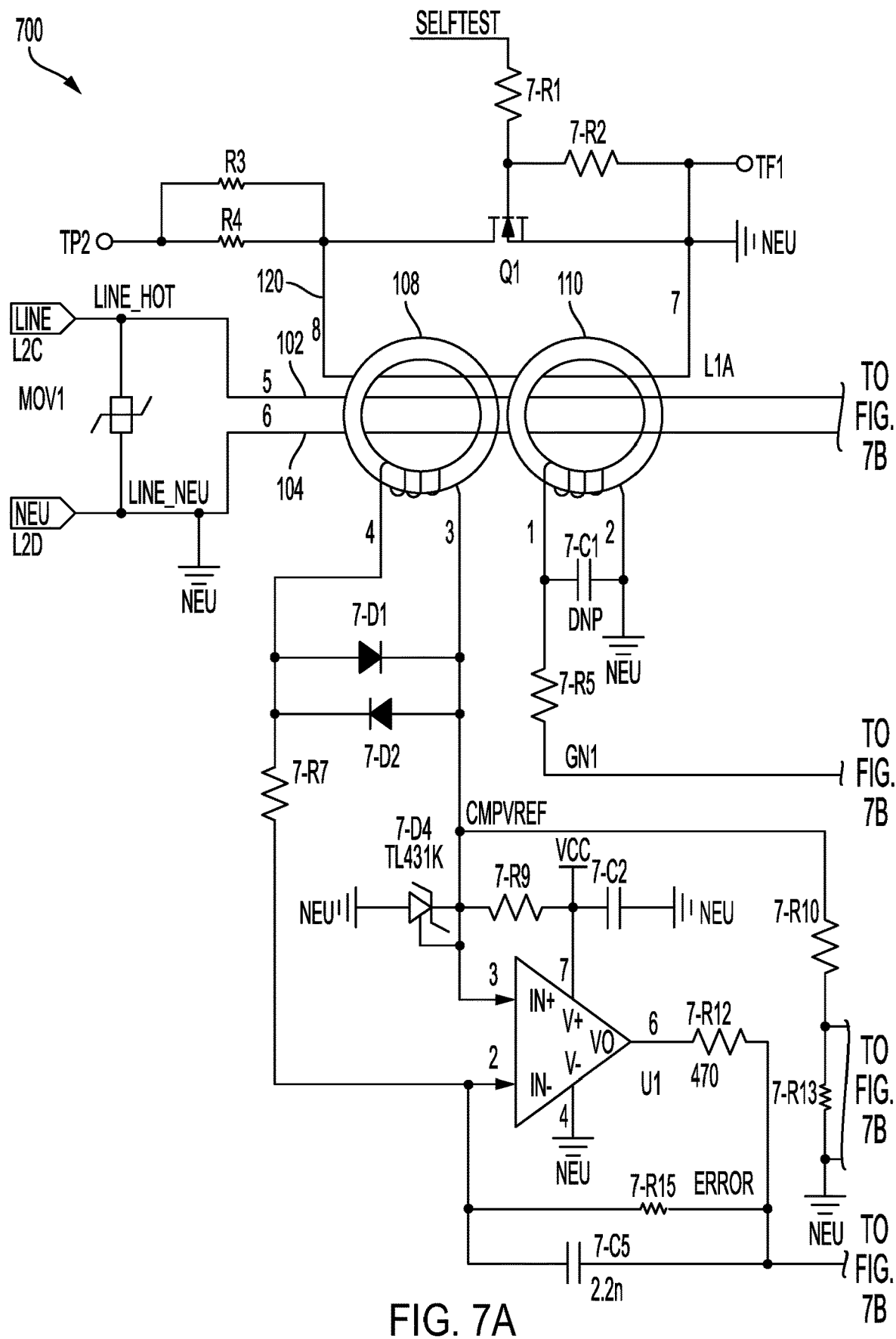
FIG. 7A is a part of a schematic of a frequency dependent ground fault interrupt circuit, according to an example.
Figure 7B:
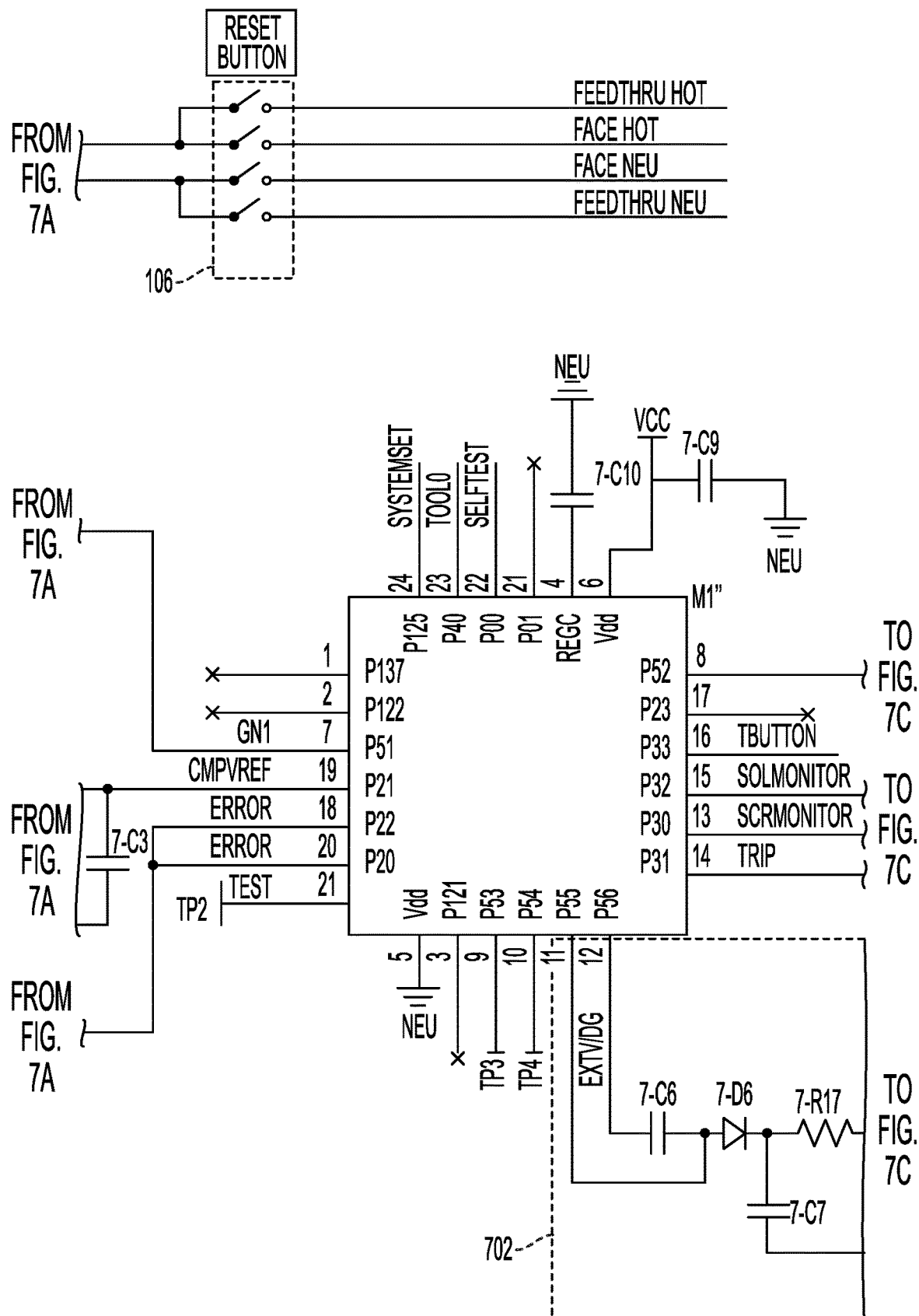
FIG. 7B is a part of a schematic of a frequency dependent ground fault interrupt circuit, according to an example.
Figure 7C:
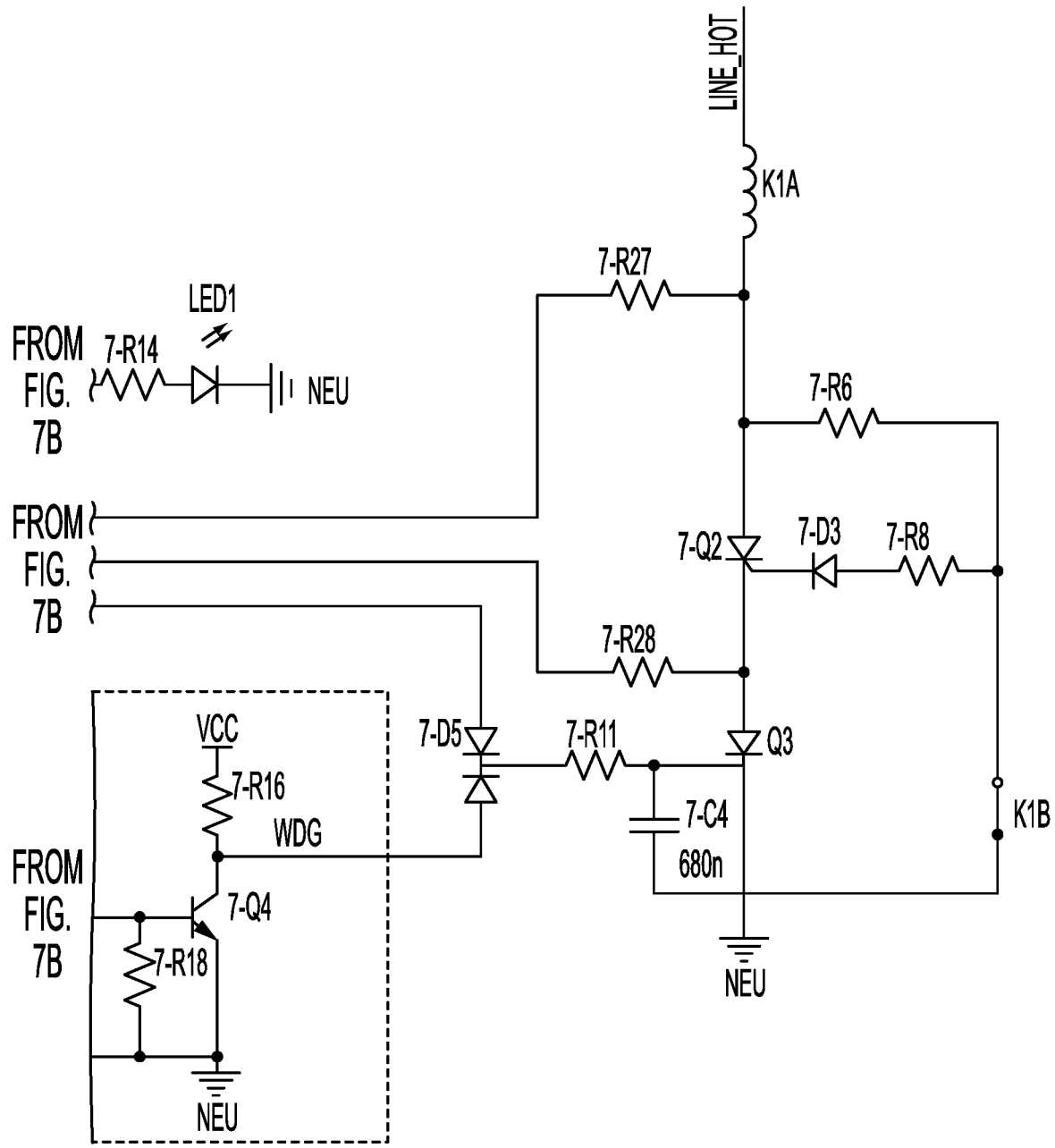
FIG. 7C is a part of a schematic of a frequency dependent ground fault interrupt circuit, according to an example.

Referring to the figures, wherein like numeral refer to like parts throughout, there is seen in FIG. 1A-1B an electrical wiring device 100 being configured to implement a current differential threshold that varies as a function of frequency. The wiring device 100, as shown, includes line-side terminals comprising a line phase terminal (LINE) and a line neutral terminal (NEU). Opposite the line-side terminals are the load-side terminals including load phase terminal (FACE_HOT) and load neutral terminal (FACE_NEU) (shown in FIG. 7B). Line phase terminal (LINE) is connected to load phase terminal (FACE_HOT) by line conductor 102. Similarly, line neutral terminal (NEU) is connected to load phase terminal (FACE_NEU) by neutral conductor 104. A set of separable contacts 106 is respectively positioned along the line conductor 102 and neutral conductor 104 to break the connection between the line-side terminals and the load-side terminals. The separable contacts are further positioned to break contact with feedthrough terminals FEEDTHRU_HOT and FEEDTHRU_NEU. (Although the load-side terminals, feedthrough terminals, and separable contacts 106 are depicted in FIGS. 7A-7C and omitted from FIG. 1A-1B, it should be understood that they are likewise included in electrical wiring device 100.)

Electrical wiring device 100 further includes a differential transformer 108 configured to generate a voltage signal proportional to a current imbalance (alternatively referred to as a "differential current" or "current differential") between line conductor 102 and neutral conductor 104. This voltage signal is amplified by an inverting amplifier circuit formed by operational amplifier U2 and its associated components, shown as resistor R5, R6, and R8. (Alternatively, other and/or additional appropriate amplifier circuits can be used to achieve the required signal characteristics.)

Figure 2:
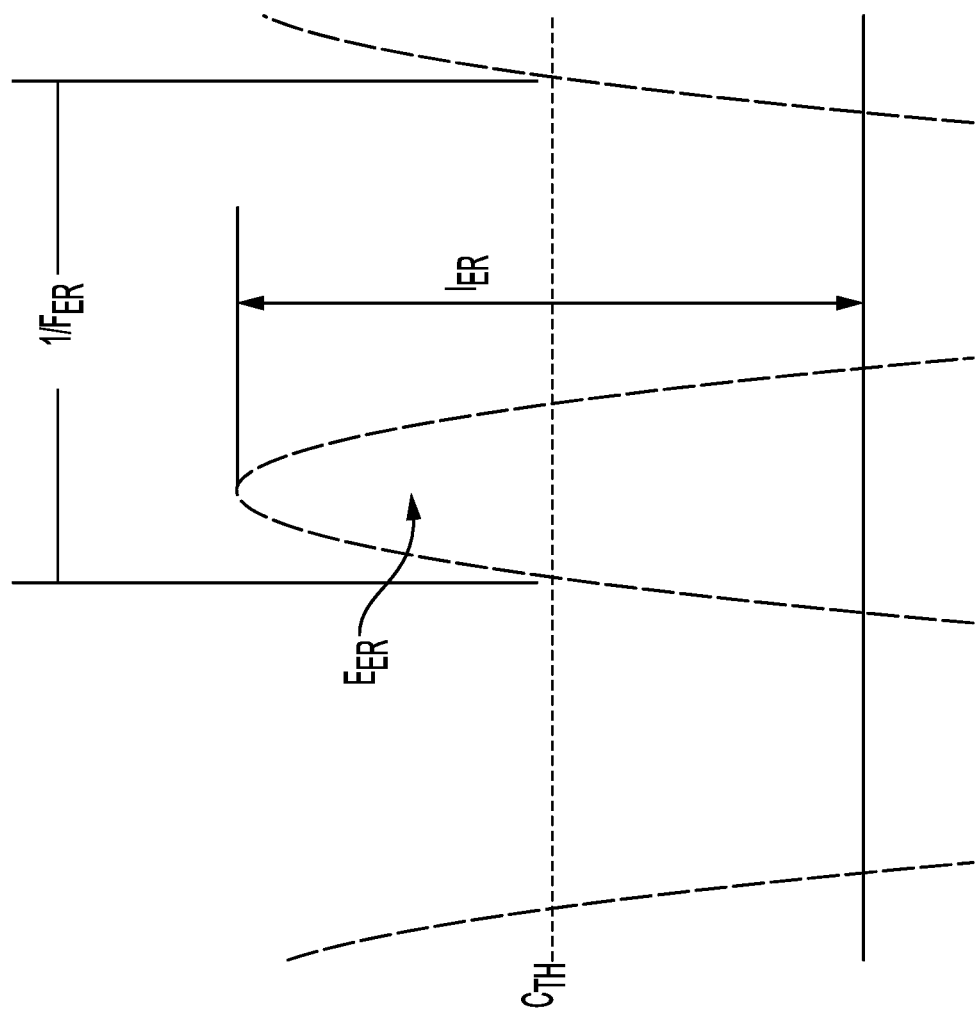
FIG. 2 is a portion of a plot of a voltage signal representative of differential current as compared to a threshold, according to an example.

The amplified output signal is input to controller M1 at pin 12 (P03). Controller M1 determines, from this input, the period (and, consequently, frequency) of the amplified voltage signal representative of the differential current. In one example, a comparator compares the amplified voltage signal to a reference voltage—input to controller M1 at pin 13—to determine when the amplified voltage signal exceeds the reference signal. As shown in FIG. 2, each time the reference signal exceeds the comparator threshold, $C_{TH}$ (alternately referred to as a "reference voltage"), an interrupt is serviced by the controller M1. By servicing an interrupt each instance the reference voltage $C_{TH}$ is exceeded, the period of the amplified voltage signal can be measured by, e.g., counting machine cycles between successive interrupts. Alternatively, the comparator can be configured to measure the falling edge of the amplified voltage signal by configuring an interrupt each time the reference voltage $C_{TH}$ ceases to be exceeded. In either case, a threshold value $C_{TH}$ is used to determine the period ($1/F_{ER}$) of the amplified voltage signal. For the remainder of this disclosure, the calculated frequency, as determined from the period, will be used; however, it should be understood, that, in various examples, the measured period can be used directly. In the example of FIG. 1A-1B, the comparator threshold is determined according to the input at pin 13 of controller M1.

Figure 3:
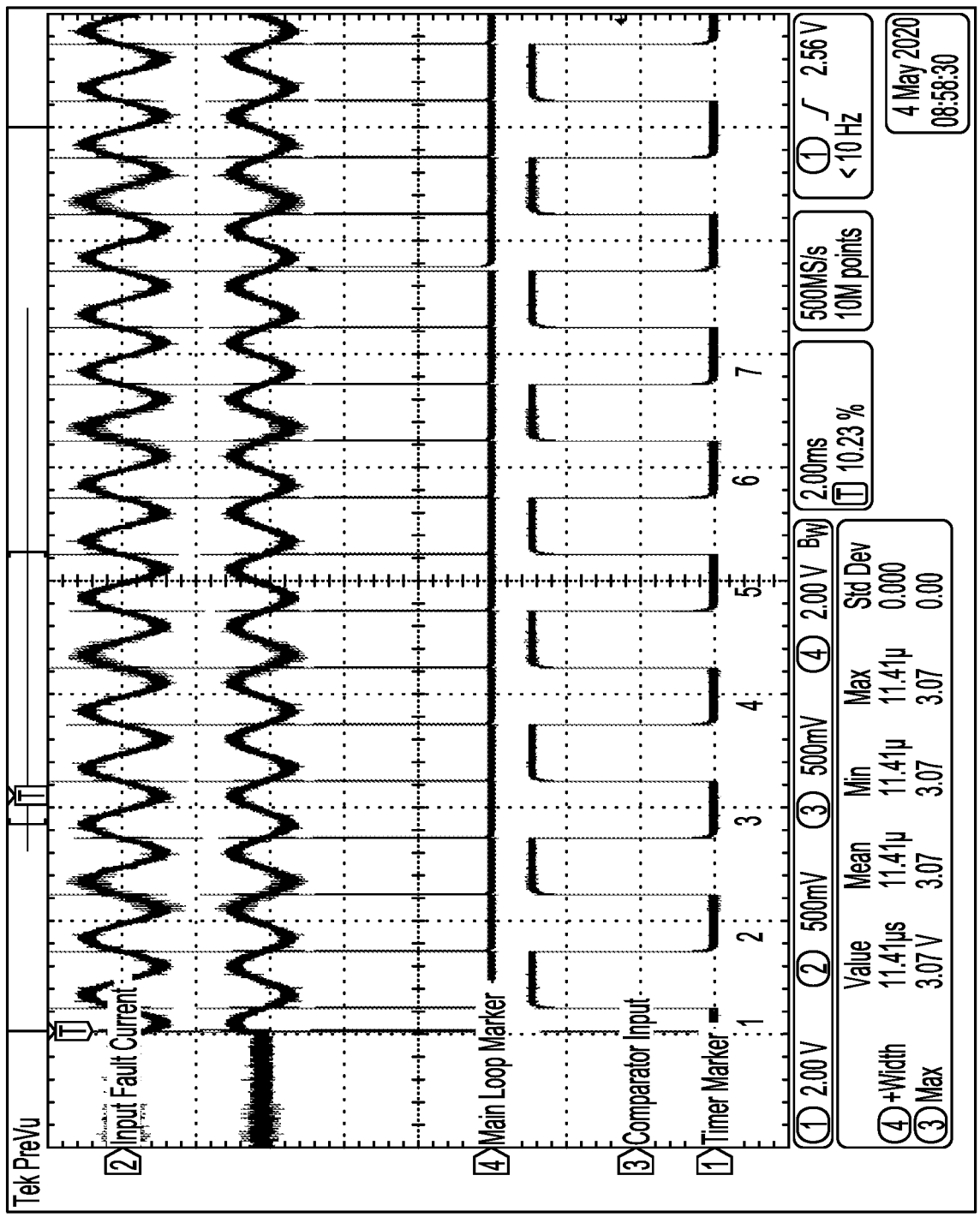
FIG. 3 shows a plot of various signals within the frequency dependent ground fault interrupt electrical wiring device, according to an example.
Figure 4:
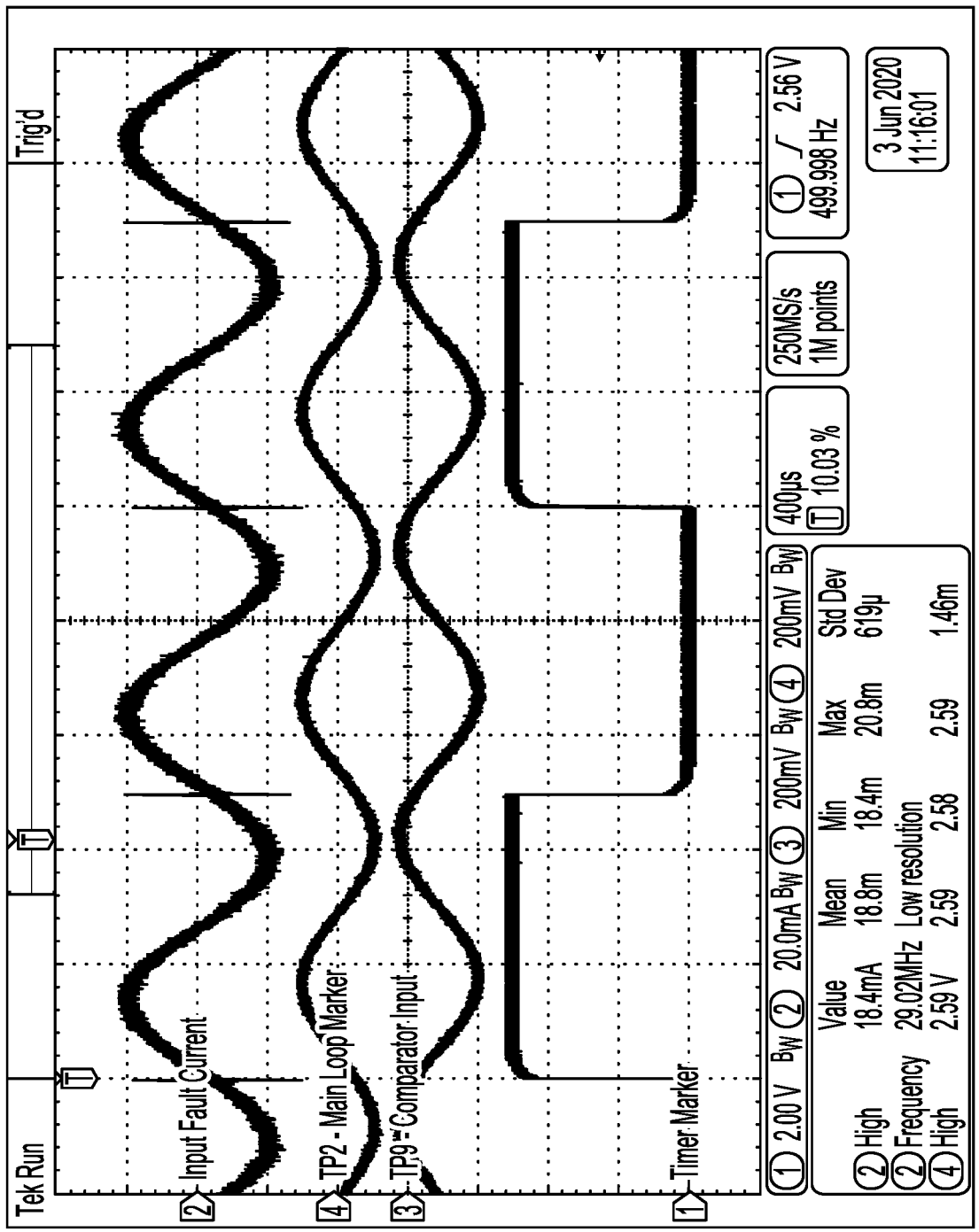
FIG. 4 shows a plot of various signals within the frequency dependent ground fault interrupt electrical wiring device, according to an example.

An example of such a comparator input and the resulting outputting is shown in FIGS. 3 and 4 (FIG. 4 being a magnified version of the plot shown in FIG. 3), in which the comparator input and the timer marker is shown. The timer marker represents each period as determined from the comparator output and interrupts described above. As shown, the timer marker accurately reproduces the period of the measured differential current and from which the frequency can be derived. (For reference, the input fault current, which represents the amplified output of the differential transformer, and the main loop marker, which is output of the low pass filter described in detail below, are also provided in FIGS. 3-4.)

Frequency relates directly to the level of leakage current that is permitted without tripping. Stated differently, the frequency of the leakage current determines the current limit (as proportionally represented by the voltage signal output from differential transformer 108 and amplified at the output of U2) at which electrical wiring device 100 is tripped. The trip threshold (alternatively referred to as "limit" or "current limit"), as it relates to leakage current frequency, can be stored as lookup table in controller M1, which, in the abstract (as the lookup table is not stored as a visual table but rather as a functional relationship of a given limit to a particular measured frequency range), can take the following form:

TABLE 1

| $E_{Dalziel}$ | $F_{ER}$ | $I_{limit}$ |
|---|---|---|
| $E_{D1}$ | Min | 5 mA |
| ... | ... | ... |
| $E_{D255}$ | Max | 70 mA | where $E_{Dn}$ represents one of 255 stored current limits, where $F_{ER}$ is the frequency, and $I_{limit}$ represents the associated current limit. Thus, where $F_{ER}$ is at the minimum frequency (that is, at or less than the fundamental frequency of 60 Hz) the current limit, identified as $E_{D1}$, is 5 mA; whereas at the maximum stored frequency (e.g., approximately 250 kHz) the current limit is 70 mA. Of course, the lookup table is not limited to 255 entries; rather, in various alternative examples the lookup table can include any number of entries suitable for rendering the Dalziel curve with acceptable granularity. In one example, controller M1 can implement a frequency threshold for determining one of two current limits. This would be equivalent to instituting a lookup table with only two entries. However, in practical application, the lookup table will include enough entries to approximate the Dalziel curve with enough granularity to meet the requisite industry standard(s). Furthermore, it will be understood that there will necessarily be some maximum frequency at which all higher frequencies will have the same current limit applied (in this example, frequencies above the maximum frequency MAX). This frequency can be selected according to the requirements of industry standards and/or the sample rate limits of controller M1. In one example, the maximum frequency is approximately 26 kHz, although other maximum frequencies are possible.

The magnitude of the leakage current itself is measured as a second input to controller M1 at pin 10 (P01). In this example, controller M1 converts the input to pin 10 to a digital value using an A/D converter and determines from the input the peak of the voltage signal in order to compare the peak $I_{ER}$, as shown in FIG. 2, against the limit determined by the measured frequency (or period) of the signal, as described above. As shown in FIG. 2, the frequency can be calculated from the measured period in which the peak is located (in which case, the current limit is not applied until the period is measured at the next threshold crossing). Alternatively, the threshold that is applied to a given measured peak can be determined from a previous measured period (that is, the frequency can be calculated from a period that preceded the period in which the peak is measured) or a later measured period. In yet another example, the frequency can be measured according to more than one period. For example, the frequency can be an average frequency measured over multiple periods.

The input to controller M1 at pin 10, i.e., the input to measure the peak of the voltage signal, can itself be filtered by an intervening low pass filter formed by U1 and its associated components, shown as capacitors C4 and C5 and resistors R3, R7, and R9. This low pass filter functions to attenuate higher frequency signals, since it is less important to distinguish between high and low current faults at higher frequencies. At lower frequencies, the magnitude of the current differential dictates the speed at which the trip needs to occur. In other words, at low frequencies, higher magnitude current differentials (e.g., 30 mA) mandate faster trip times than lower current differentials (e.g., 5 mA). It is thus necessary to maintain the distinction between higher current differentials and lower current differentials at lower frequencies, but it is not similarly necessary to distinguish between high current differentials and low current differentials at high frequencies. Accordingly, the input to controller M1 at pin 10 can be filtered at high frequencies with the low pass filter.

As a result of the attenuation at higher frequency, it is necessary to apply smaller reference signal to the comparator to trigger an event. As shown, a voltage divider is shown using R17, R18 and C8 such that a large percentage of the virtual ground of electrical wiring device 100 is input into controller M1 at pin 13. This voltage divider provides the ability to choose at what current level comparator interrupts are created. Choosing the comparator current level at 3 mA for example will allow current levels below that to be ignored by the controller M1 eliminating unnecessary computing or processing.

The low-pass filter in this example functions to increase computational efficiency with respect to the controller M1. Stated differently, failing to filter the input to the controller requires controller M1 to exclude and discriminate against low current differentials (e.g., 5 mA) at higher frequencies. By filtering such low current differentials, controller M1 only compares inputs to a current limit that are likely to exceed the determined current limit in the first place. It should be understood that, because the low-pass filter attenuates output, the look up table implemented by controller M1 must take into account the attenuation effected by the low-pass filter for each frequency. Thus, for example, if the current limit for a 10 kHz signal is 30 mA and the low pass filter attenuates the voltage signal at 10 kHz to a value proportional to 5 mA (without attenuation), then the look up table must set the current limit at 10 kHz to 5 mA rather than 30 mA to take into account the attenuation of the low-pass filter. (It should be understood that in various alternative examples, the low pass filter can be excluded, and the output of the amplifier of U2 can be input directly to the controller M1 or M1'.)

Figure 5A:
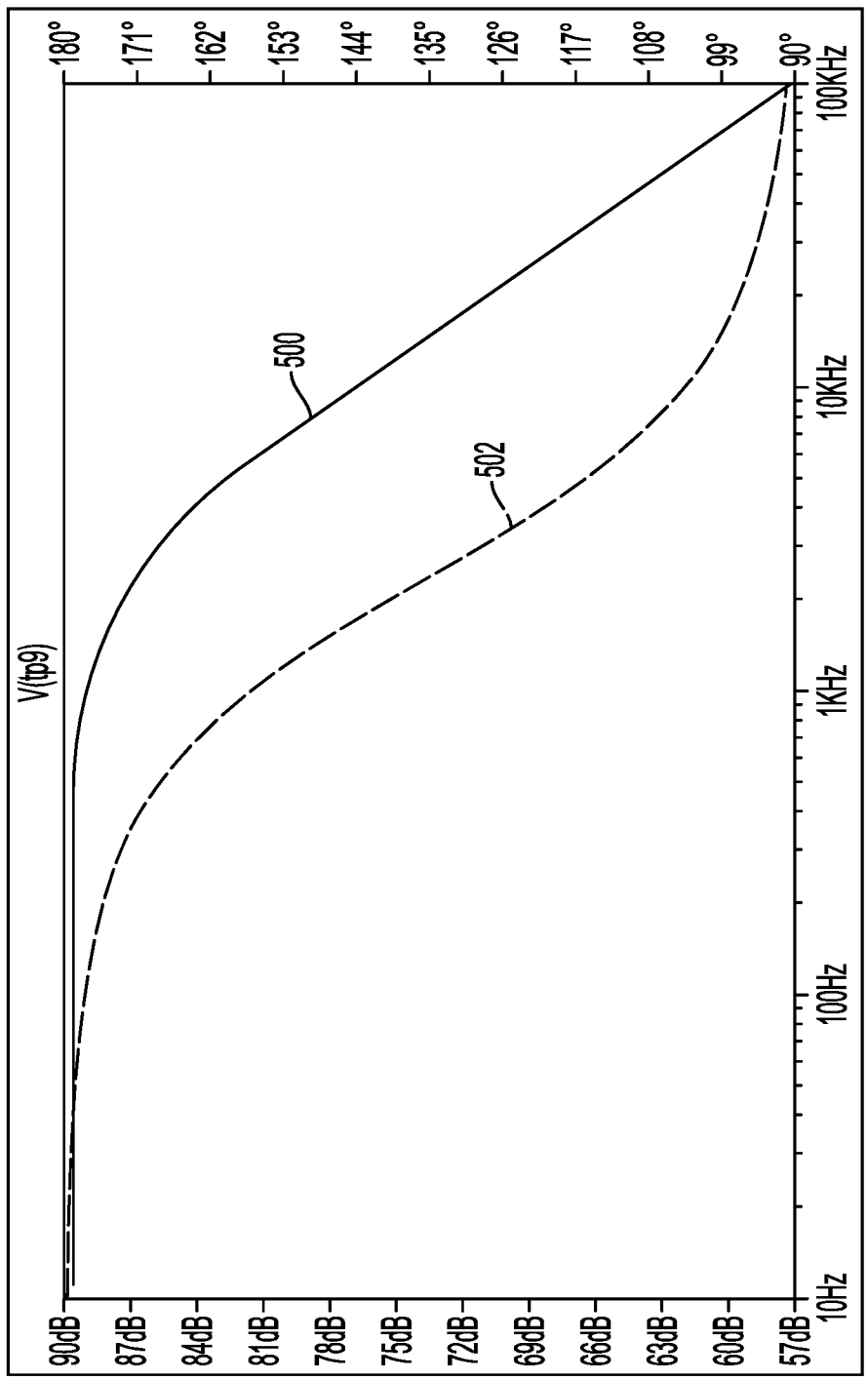
FIG. 5A shows a plot of a frequency response of a typical ground fault interrupt circuit and a frequency dependent ground fault interrupt circuit, according to an example.
Figure 5B:
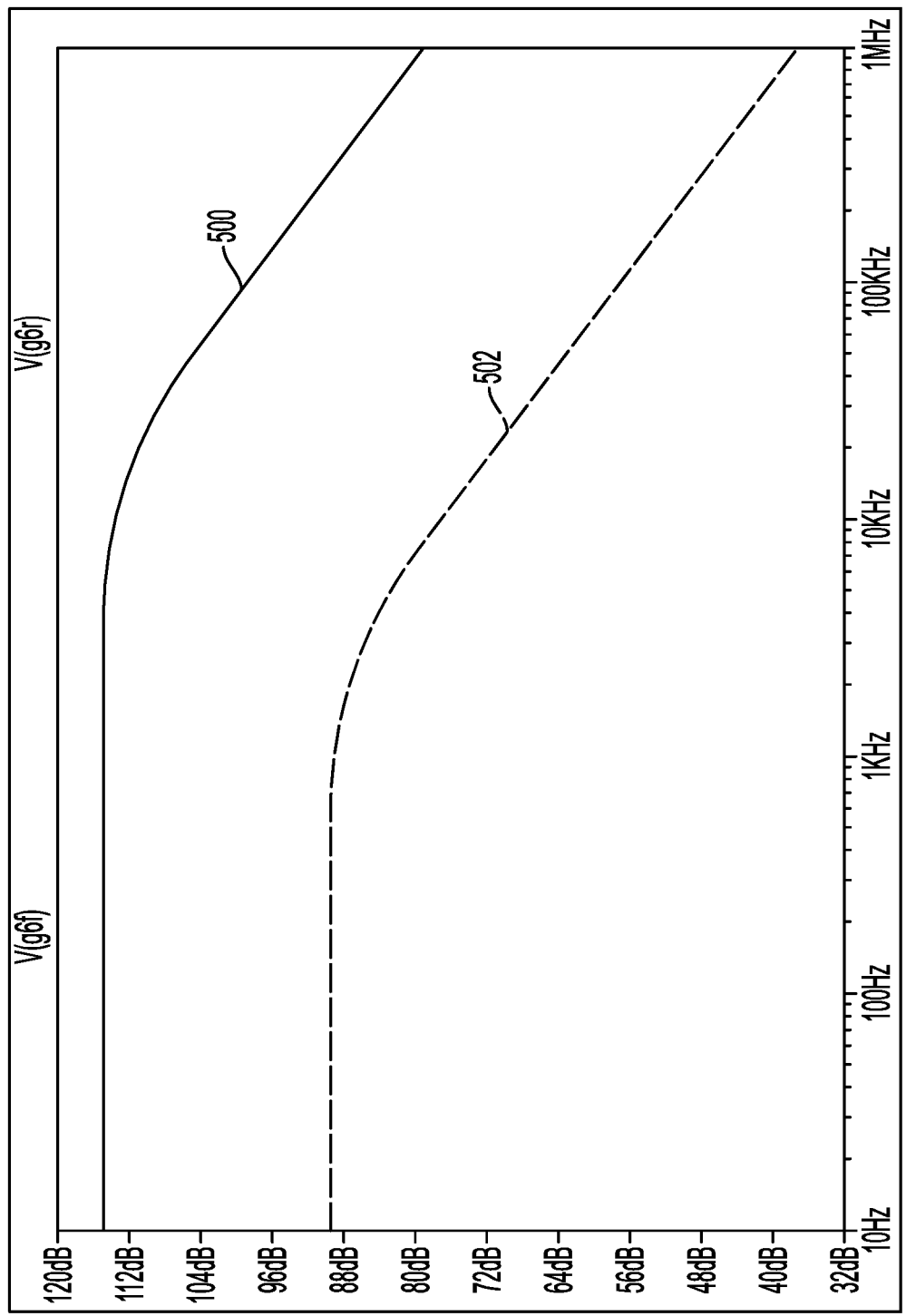
FIG. 5B shows a plot of a frequency response of a typical ground fault interrupt circuit and a frequency dependent ground fault interrupt circuit, according to an example.

FIGS. 5A-5B illustrate the frequency response (500) of a standard 5 mA GFCI (which does not intentionally address trip levels at frequencies greater than the fundamental 60 Hz frequency) and the frequency response of a frequency-dependent GFCI (502) (e.g., as implemented according to the example of FIGS. 1A-1B). FIG. 5B depict the same curves in each, but individually provide details on the corner frequency for the standard GFCI and frequency dependent GFCI, respectively. Note that curve of the frequency dependent GFCI shown in FIGS. 5A-5B illustrates the frequency response of one out of multiple examples of the low pass filter used in a frequency dependent GFCI. When contrasting the curves of 5B, one may note two significant differences. First, the corner frequency, otherwise known as the 3 d B frequency associated with the frequency dependent GFCI (approximately 86 dB), is much lower than that of the standard 5 mA GFCI (approximately 112 dB). Where the low pass filter of the standard GFCI is concerned with eliminating noise at higher frequencies, the low pass filter described in this disclosure is implemented to approximate the Dalziel curve in order to increase computational efficiency of controller M1, as described above. Second, the low frequency gain of the frequency dependent GFCI is significantly lower than the standard 5 mA GFCI.

Controller M1 can, for example, be a microcontroller including a processor and a nontransitory storage medium storing program code that, when executed by the processor, carries out the various functions described in this disclosure (e.g., determining the frequency or comparing the differential current to the current limit). While controller M1 is shown being implemented as a single microcontroller, it should be understood that controller M1 may, in alternative examples, be implemented by several microcontrollers and/or by hardware, acting to perform the various functions described in connection with controller M1. For example, the functions and structure of the frequency detection, peak detection, and lookup table can be distributed across multiple microcontrollers or hardware (comparator, for example, may be implemented by an operational amplifier separate from controller M1, as such comparators are known in the art).

Figure 6:
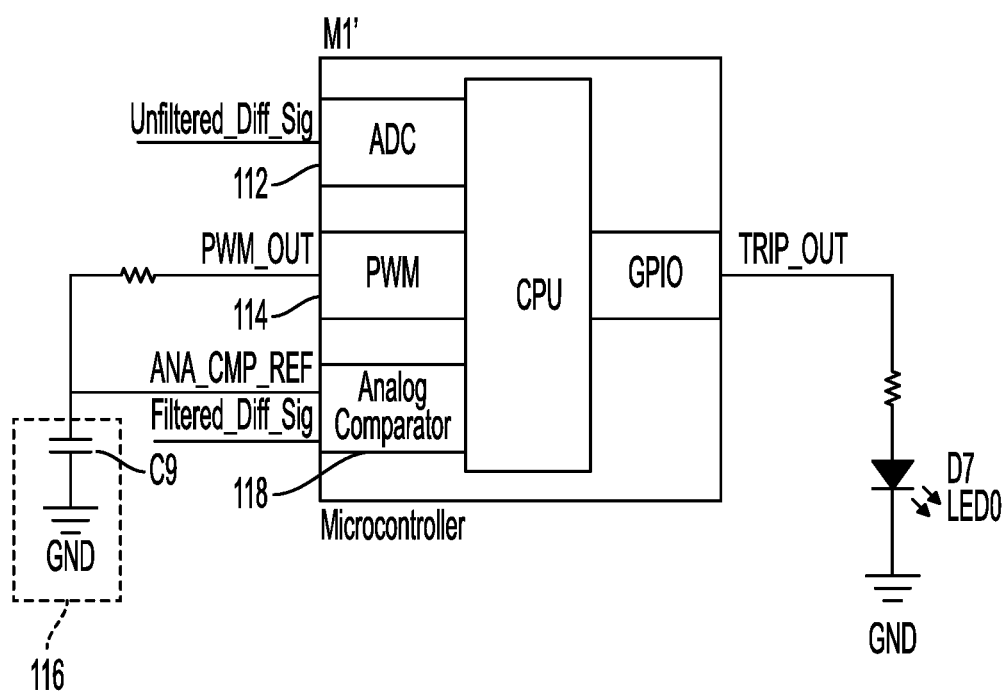
FIG. 6 shows a controller of a frequency dependent ground fault interrupt circuit, according to an example.

An alternative example of controller M1, denoted as M1', is shown in FIG. 6. In this example, the amplified voltage signal is converted to a digital signal by an analog-to-digital converter 112 (ADC) within controller M1'. From the digital signal, controller M1' generates a pulse width modulation (PWM) signal, at PWM 114, based on the converted digital signal. The controller configures the PWM signal with a duty cycle proportional to the frequency of the amplified voltage signal as measured by controller M15. (The frequency can be determined according to the methods of determining frequency described above in conjunction with FIGS. 1-2.) Prior to the next stage of signal processing, an external smoothing circuit 116 is used to generate a reference voltage signal. The reference voltage signal is thus proportional to both the duty cycle of the PWM signal and the frequency of the amplified signal representative of the differential current (since the PWM is determined from the frequency). In the example of FIG. 6, the smoothing circuit is formed by capacitor C9, disposed in parallel with the input of comparator circuit 118 (it should, however, be understood that any circuit suitable for generating a voltage proportional to the duty cycle of the PWM signal may be used).

Controller M1' then utilizes internal comparator circuit 118 to compare the output of the low pass filter formed by U1 (and the associated components) to the reference signal. As described above, the reference voltage signal is proportional to the frequency of the differential current. If the output voltage of the low pass filter does not exceed the reference voltage signal, comparator 118 outputs LOW, and electrical wiring device 100 is not tripped. However, if the output voltage of the LPF exceeds the reference signal at any frequency, the comparator outputs HIGH, and electrical wiring device 100 is tripped. The smoothed PWM signal thus forms the voltage to which the current differential is compared (i.e., the current limit), representing an alternative to the look up table stored in the example of controller M1.

The example of M1' includes an ADC 112, PWM 114, and analog comparator 118. Any of these components can be implemented in hardware apart from a microcontroller or in a separate microcontroller. This forms one example of how controller M1 can be implemented as hardware only, as a combination of a microcontroller and hardware, or as multiple microcontrollers.

Furthermore, while the example of FIG. 1A-1B depicts separate amplification and filtering stages, in an alternative example, these stages can be collapsed into a single stage, the output of which is used for both the frequency detection and the peak detection. Such a single-stage amplifier and low pass filter (known as a transimpedance amplifier) is shown in FIG. 7A-7C, formed by 7-U1 and its associated components, shown as 7-R7, 7-R15, 7-C5, and 7-R12. Such transimpedance amplifiers are known in the art and other suitable transimpedance amplifier can be used.

Figure 8:
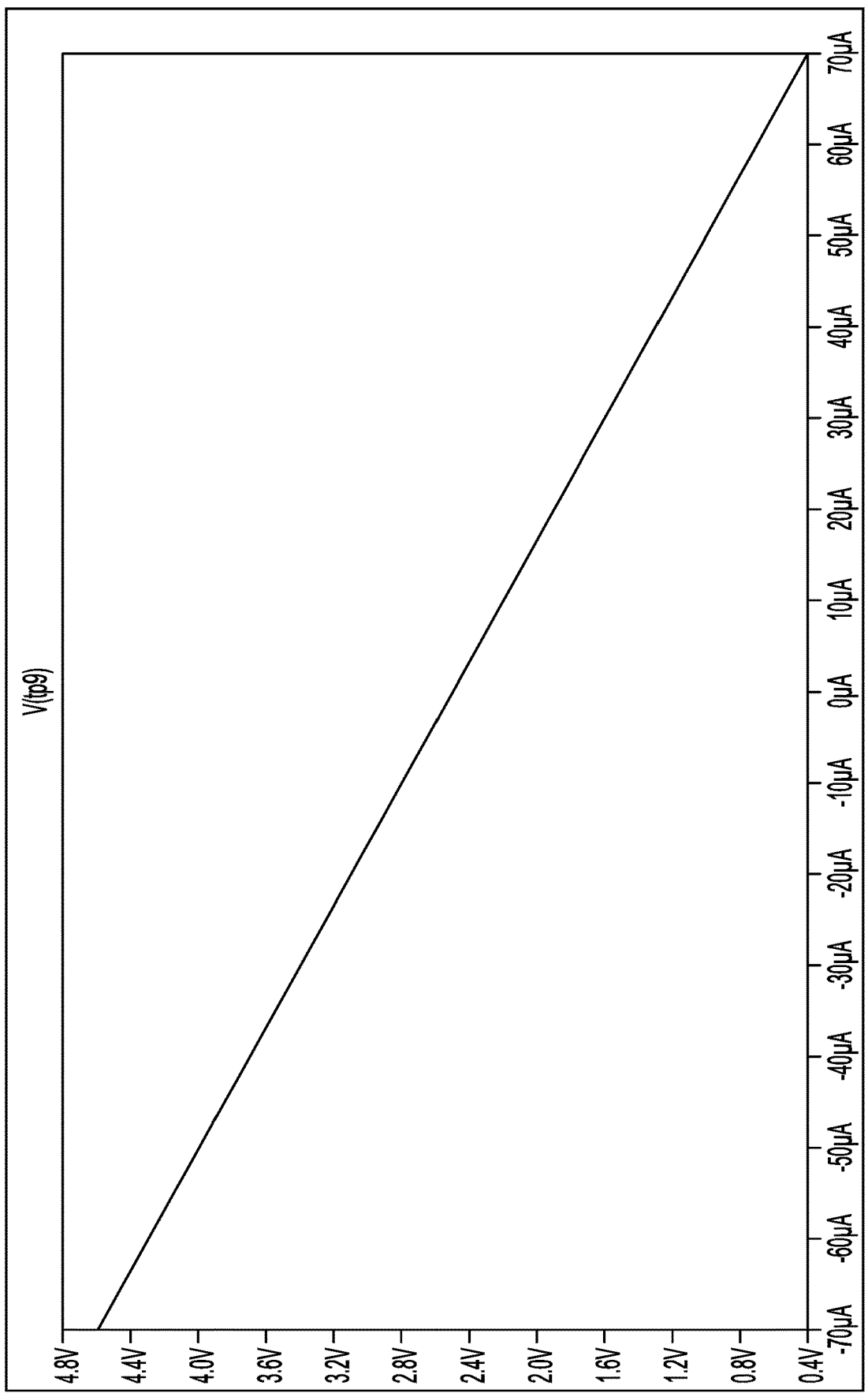
FIG. 8 is a plot of a DC response of a transimpedance circuit of the frequency dependent ground fault interrupt circuit of FIG. 7, according to an example.

It should be understood that the choice of low frequency gain in FIG. 7A-7C is such that the full range of faults can be detected by controller M1". An example of a suitable low frequency gain is illustrated in FIG. 8 which is the DC response, or transfer function, of the transimpedance circuit formed by U1 and its associated components in FIG. 7A-7B. As shown positive or negative 0 to 70 mA fault can be measured by the 5V limited analog-to-digital converter present in controller M1.

Controller M1" in FIG. 7B is an alternative example of controller M1, and is likewise configured to receive inputs from which it determines the frequency of the differential current (pin 18) and an input representative of the magnitude of the differential current (pin 20), to which it compares a respective current limit according to a look up table, as described above. In addition, controller M1" is configured to provide an input to controller integrity detection circuit 702 and a standard or non-standard current differential on third conductor 120 as will be described in more detail below.

However, it should be understood that the transimpedance amplifier of FIG. 8 can be used in conjunction with controller M1 and M1' as described above, separate from the additional features of controller M1".

Figure 9:
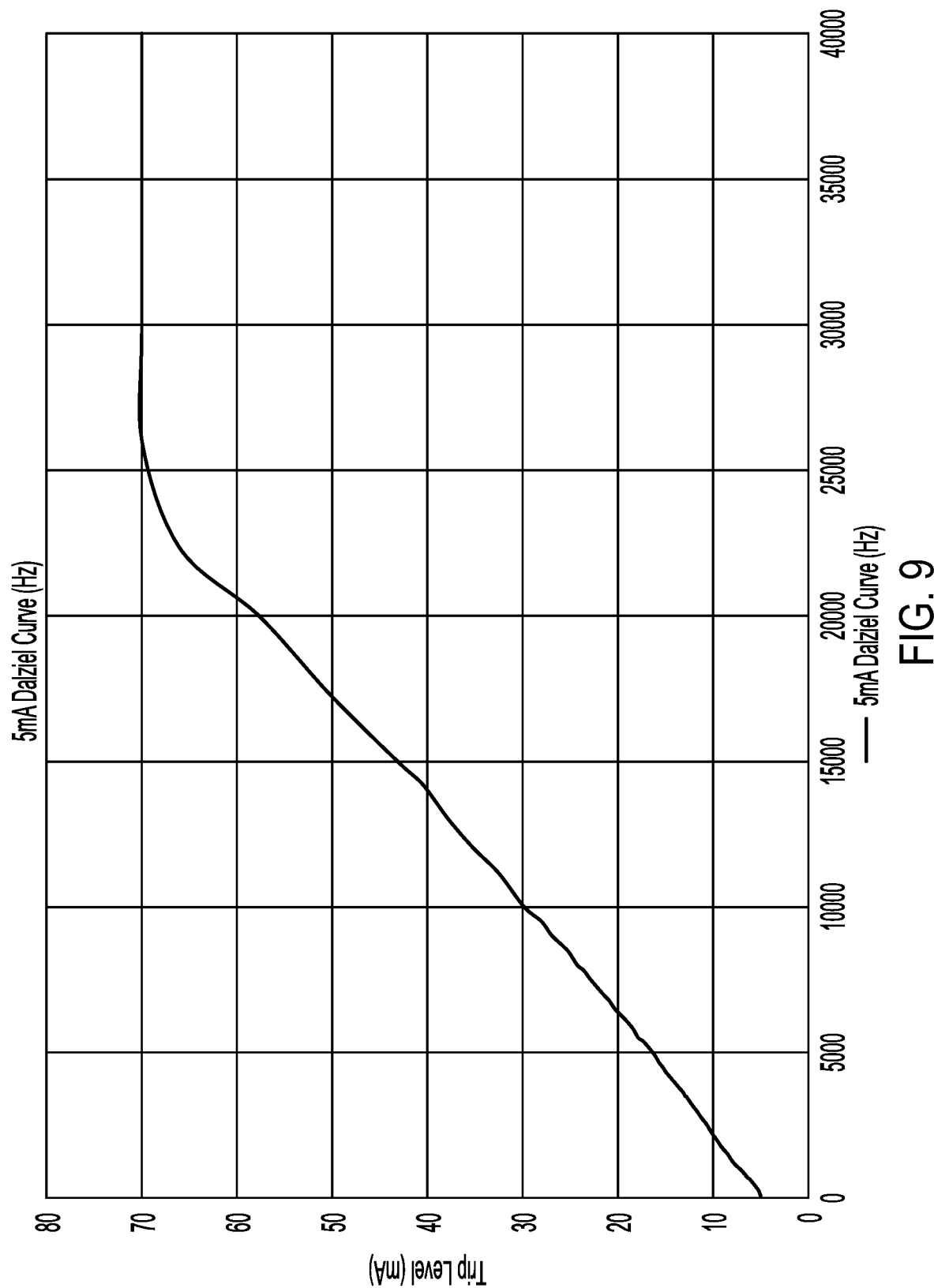
FIG. 9 is a plot of a current limit against frequency of a frequency dependent ground fault interrupt circuit, according to an example.

FIG. 9 depicts a plot of current limit against frequency, as implemented according the example electrical wiring devices 100, 700 of FIGS. 1, 6 and 7. As shown, the current limit increases from 5 mA to 70 mA from 60 Hz to approximately 250 kHz. Of course, as described above, this is only one example of an implementation of the Dalziel curve.

In any of the examples of FIG. 1, 6, or 7, once a fault is detected by controller M1, M1', M1", controller M1, M1', M1" is configured to output a trip signal to trigger a trip mechanism in order to open a set of interrupting contacts 106. More particularly, as shown in FIG. 7B-7C, such a trip signal closes SCR Q3 to allow current to flow through solenoid K1A, creating a magnetic field which serves to open a set of interrupting contacts 106 that interrupt the flow of current to the load terminals (i.e., FACE HOT and FACE NEU) and to downstream devices (i.e., FEEDTHRU HOT and FEEDTHRU NEU). (Although SCR Q3 and solenoid K1A are omitted from FIG. 1A-1B, it should be understood that these components are included in electrical wiring device 100, operatively connected to receive a trip signal in the event that a fault is detected by controllers M1 or M1'.)

Interrupting contacts 106 may be implemented as an electromechanical device, and any known interrupting contacts may be used to separate the line terminals from the load terminals. One such set of interrupting contacts, the electromechanical device that supports their operation, is taught in U.S. Pat. No. 9,437,386 directed to a "Protective Wiring Device," the entire disclosure of which is incorporated herein by reference. Likewise, any suitable circuit for tripping the interrupted contacts, rather than only SCR Q3 and solenoid K1A, can be used as appropriate.

Relying, however, on controller M1, M1', or M1" to detect a fault and generate the trip signal introduces a potential single point of failure that could prevent electrical wiring device 100, 700, from properly operating (i.e., tripping in the present of a fault condition) were controller M1, M1' or M1" to fail. Accordingly, FIG. 7B-7C depicts an example Controller Integrity Detection (CID) circuit 702, which functions to trip the electrical wiring device 700 if controller M1" fails. More specifically, CID circuit 702 connects SCR Q3 to VCC (DC high) when CID circuit 702 fails to receive an input signal from controller M1" after a predetermined period of time. CID circuit 702 thus requires a periodic input signal from controller M1" to prevent tripping electrical wiring device 700, thereby checking the operability of controller M1". If controller M1" fails, CID circuit 702 will receive no input, thus connecting SCR Q3 to VCC and tripping electrical wiring device 700. If the user resets electrical wiring device 700, it will immediately trip again because SCR Q3 is still connected to VCC. CID circuit 702 thus provides a check to the integrity of controller M1".

As shown in the example of FIG. 7B-7C, CID circuit 702 comprises an inverter circuit comprising a resistor 7-R16 connected between VCC and the collector of BJT 7-Q4. The emitter of BJT 7-Q4 is connected to ground. As a result, if the voltage at the base of BJT 7-Q4 (Vbe) is not high enough, BJT 7-Q4 will be OFF and the output WDG of the CID circuit 702 will be HIGH due to VDD. However, if the voltage at the base of BJT 7-Q4 (Vbe) is high enough then BJT 7-Q4 will be ON, and the DC voltage of VCC will drop across resistor R16 and thus the output WDG of the CID circuit 702 will be LOW. (It should be understood that BJT 7-Q4 is only one kind of switch that can be used, and, in various alternative examples a FET or any other suitable type of switch can be used.)

The voltage at the base of BJT 7-Q4 is maintained by capacitor 7-C7, which is charged by the EXTWDG output of pin 56 of controller M1". Thus, to prevent CID circuit 702 from turning SCR Q3 ON and tripping electrical wiring device 502, controller M1" must deliver a voltage output signal EXTWDG at pin 56 that charges capacitor 7-C7 to a voltage to maintain BJT 7-Q4 ON. (Resistors R17, R18, form a voltage divider to condition the voltage across capacitor 7-C7 to tune the voltage provided to BJT 7-Q4, according to the output signal provided by controller M1", the size of capacitor 7-C7, the characteristics of BJT 7-Q4, etc., in order to achieve the desired operating characteristics of CID circuit 702.) Of course, the voltage output signal at pin 56 need only be high enough to retain a charge on capacitor 7-C7 that prevents electrical wiring device 502 from tripping. This does not mean that the output of CID circuit 702 can never go HIGH. Indeed, the voltage out of CID circuit 702 can be allowed to temporarily go HIGH, but only for a period of time that is insufficient to turn ON SCR Q3 in a manner that trips electrical wiring device 700. For example, the output signal of pin 56 can be of a magnitude and length sufficient charge capacitor 7-C7 to a voltage that causes the output of CID circuit 702 to go LOW. Once the output of controller M1" pin 56 goes LOW, the voltage across capacitor 7-C7 will begin to decay. In one example, the output of controller M1" pin 56 can go HIGH again before the voltage across capacitor 7-C7 drops to a value that causes the output of CID circuit 702 to go HIGH. In an alternative example, the output of controller M1" pin 56 can go HIGH again after the voltage across capacitor 7-C7 drops to a value that causes the output of CID circuit 702 to go HIGH, but not long enough to trip electrical wiring device 700. In one example, the output of CID circuit 702 can go HIGH during the negative half-cycle, turning SCR Q3 ON but preventing the device from tripping. This can function as a dual-purpose test, both testing the functionality of controller M1" and the operability of SCR Q3 by testing whether SCR Q3 connects solenoid K1A to ground.

By mandating that controller M1" provide a particular output signal to CID circuit 702 to avoid tripping, the integrity of controller M1" is continually checked during the operation of electrical wiring device 700. If controller M1" fails, and thus ceases to provide the output signal to pin 56, the electrical wiring device will immediately trip each time it is reset, preventing meaningful use of the electrical wiring device.

In alternative examples, capacitor 7-C7 can be excluded and controller M1" can simply provide voltage directly to the base of BJT 7-Q4. This, however, would require that the output of pin 56 be HIGH for a portion of each cycle necessary to prevent tripping. In other words, capacitor 7-C7, by maintaining a charge, can allow for smaller and shorter duration output signals from pin 56.

Furthermore, capacitor 7-C6 is positioned to block DC voltages, which could result, if for example, controller M1" fails in manner that causes the output of pin 56 to continuously go HIGH. In this instance, capacitor 7-C6 will block the DC output signal, and BJT 7-Q4 will turn OFF, tripping electrical wiring device 700. Likewise, diode 7-D6 guards against negative voltages that could be output from controller M1" pin 56 in the event of failure. In alternative examples, either or both of capacitor 7-C6 and diode 7-D6 can be excluded. While this example would permit controller M1" to emit a DC HIGH output voltage from pin 56 for at least the positive half-cycle of the line voltage in order to prevent tripping of electrical wiring device 700 (thus, perhaps obviating the need for capacitor 7-C7), it would not guard against the controller M1" from failing in a manner that produces a DC HIGH at pin 56, nor from negative voltages at the base of BJT 7-Q4.

Furthermore, controller M1" can be configured to run diagnostics related to the integrity of the electrical wiring device (alternately referred to as "external diagnostics" as these diagnostics are dependent on the functionality of components outside controller M1") or of itself (alternately referred to as "internal diagnostics") as a prerequisite for producing the signal at pin 56. For example, controller M1" can be configured to only produce the HIGH signal at pin 56 in the event that the external diagnostic tests (e.g., self-test) are each passed. Alternatively, or additionally, controller M1" can run internal diagnostics of its software, firmware, and/or hardware, and be configured to only produce the HIGH signal at pin 56 in the event that the internal diagnostics each pass. Stated differently, if any other these internal diagnostics fail, controller M1" can be configured to not produce HIGH signal at pin 56, causing electrical wiring device 700 to trip, until such diagnostic tests each pass.

Each of the internal and/or external diagnostic tests can be continually performed at some predetermined interval (e.g., each cycle or half-cycle of the LINE cycle). The predetermined interval for each particular diagnostic test can vary according to the test. For example, controller M1" can be configured to run one diagnostic test or set of diagnostic tests every half cycle and another diagnostic test or set of diagnostic tests every cycle. In one example, different sets of diagnostic tests can be alternated each half-cycle. The timing demands of each diagnostic test will often be determined by relevant industry standards, and controller M1" can be configured to administer each diagnostic test in manner that satisfies the relevant standard.

In an alternative example, rather than providing a continuous or periodic output signal that prevents a separate circuit from providing a trip signal to SCR Q3, controller M1" can be simply programmed to provide a trip signal to SCR Q3, e.g., from pin P31, in the event that any internal or external diagnostic tests fail. However, this example fails to account for an instance in which controller M1" fails entirely, as, in this case, controller M1" will be unable to run diagnostic tests or to output a trip signal to SCR Q3.

In an alternative example, as a hybrid of the above examples, controller M1" can be configured to provide a trip signal to SCR Q3, via, e.g., pin 31, in the event that a diagnostic test fails, and to separately provide a periodic signal or DC signal, e.g., from pin 56, to CID circuit 702 to test the ability of controller M1" to continually provide an output signal.

In one example, the trip signal output, e.g., implemented in pin 31 in the example of FIG. 7B, can be excluded. Instead, electrical wiring device 700 can be tripped by denying a signal to CID circuit 702. In this example, the existence of a fault can be regarded as one of the external diagnostics performed by controller M1". However, it is generally desirable to provide immediate tripping through a separate output, e.g., pin 31. In one example, in the event of a fault, both a trip signal can be generated at one pin, e.g., pin 31, and, separately, an output signal can be denied to the CID circuit 702, thus providing redundant measures to trip electrical wiring device 700, should one fail.

It should be understood that the CID circuit 702 shown in FIG. 7B-7C is simply one example of a CID circuit, and that, in alternative examples, any circuit that provides a HIGH output sufficient to trip an electrical wiring device in the absence of a periodic or DC signal (in various examples) received from a controller can be used as a CID circuit.

Furthermore, it should be understood that, although CID circuit 702 is shown implemented with controller M1", the examples of electrical wiring device 100 and controllers M1 and M1" can be modified to include such a CID circuit 702 in order to guard against failure of controller M1 or M1'. Furthermore, it should be understood that CID circuit 702 can be implemented in electrical wiring devices separate from a frequency dependent GFCI example. Indeed, CID circuit 702 is useful for testing the integrity of any chip operating within an electrical wiring device.

FIGS. 1 and 7 further depict the use of a third conductor 120 extending through the inner diameter of the current transformer assembly to induce simulated grounded neutral fault. In this way, a simulated ground fault can be employed by a GFCI to regularly test the GFCI's ability to detect a fault. This test is sometimes referred to as self-test or automonitoring. The third conductor 120 thus provides the GFCI with the ability to create a simulated differential or grounded neutral fault. Furthermore, in FIG. 7A-7C, this simulated fault can be controlled by any logic circuit via control of the semiconductor switch Q1 is placed in parallel to third conductor 120. In the example of FIG. 7A-7C, semiconductor switch Q1 is controlled by the controller M1" via the SELFTEST node output from pin 22. This is method of inducing a simulated ground fault is described in more detail in U.S. Pat. No. 9,362,077 in conjunction with FIGS. 28 and 29, which is herein incorporated by reference.

Additionally, as shown in FIGS. 1A-1B and 7A-7C, third conductor L1A can further be leveraged, in conjunction with a function generator and a resistance, to introduce test faults with either a standard or a non-standard frequency or shape, i.e. faults which do not align to the mains fundamental frequency or shape received by electrical wiring device 100, 500 across LINE_HOT and LINE NEU. This can be accomplished by providing an input voltage from a function generator to third conductor at TP2. The parallel combination of resistors R3 and R4 provide a limiting impedance for the voltage signal from the function generator, thus passing differential current through the differential current transformer. The differential current can be tailored to any desired value (e.g., frequency, shape) by adjusting the voltage signal provided by the function generator and the impedance of resistors R3 and R4 (resistors R3 and R4 can be tailored to provide differential current typically in the range of milliamperes of current).

For example, the function generator can supply a differential current through the current transformer with frequency at or outside of the standard 50 Hz or 60 Hz frequencies (for the purposes of this disclosure, a standard frequency is considered to be 50 or 60 Hz) of LINE_HOT. For example, the frequency of the differential current can be fixed at some predetermined value (such as 100 Hz, 500 Hz, 1000 Hz, 10,000 Hz, etc.). Alternatively, the frequency can be varied between some minimum and maximum frequency (e.g., having a range of 0 Hz to 25,000 Hz, although other ranges can be used) by varying the frequency of the voltage signal provided by the function generator.

The magnitude of the differential current can be further varied according to the frequency of the differential current. For example, the magnitude of the differential current can be tailored to test the frequency dependent GFCI described in this disclosure. For example, during the negative half-cycles of the LINE HOT voltage, the frequency-dependent GFCI 100, 500 can be tested by supplying differential currents at magnitudes and frequencies that cause the controller M1 or M1" to send a trip signal to SCR Q3 when functioning properly. (Because this is carried out in the negative half cycle, the trip signal will not cause the electrical wiring device 100 or 500 to trip). Thus, for example, if a 5 mA current differential should cause the device to trip at low frequencies (e.g., 60 Hz), then 5 mA current differential can be supplied by the function generator (e.g., controller M1") and resistance (e.g., resistors R3 and R4) at low frequency values. This current value can be increased over frequency, following the current threshold across frequency as implemented by controller M1" in accordance with the Dalziel curve or the relevant standards, as described above. In one example, where a look up table, setting a trip threshold for various prestored values of frequency or frequency ranges is implemented by controller M1", each trip threshold can be tested or some subset of trip thresholds can be tested.

In addition, or alternatively, rather than testing at or above the trip the threshold for various frequencies, function generator and resistance can provide a differential current below the trip threshold, to ensure that the controller M1" does not trip below the trip threshold for each frequency or some subset of frequencies. For example, at low frequencies a current differential less than 5 mA can be provided on the third conductor, a current differential of less than 30 mA can be provided on the third conductor at 10 kHz, a current differential less than 42 mA can be provided on the third conductor at 15 kHz, etc.

The test procedures described above do not have to occur within a single half-cycle but can occur over multiple half-cycles in order to adequately test the operability of controller M1" and the ability of SCR Q3 to respond to trips. For example, each negative half-cycle, a current differential at a selected frequency (e.g., 60 Hz, 10 kHz, 20 kHz, etc.) can be created between the third conductor and neutral conductor at a value below the trip threshold as implemented by controller M1" and above the trip threshold as implemented by controller M1". For example, in one half-cycle, a current differential of less than 5 mA (e.g., 4 mA) can be created between the third conductor at 60 Hz and the neutral conductor before increasing the current differential at 60 Hz to greater than or equal to 5 mA (e.g., 6 mA). In response, the gate voltage at SCR Q3 can be measured (e.g., by controller M1") or some other voltage can be measured to ensure that controller M1" is only outputting a trip signal in response to the correct current differential per frequency. This can be repeated for multiple frequencies (e.g., each frequency step of the look up table or some subset of frequency steps of the look up table).

Alternatively or additionally, the differential current can have a non-standard shape (for the purposes of this disclosure, a non-standard shape is a non-sinusoidal shape). For example, the current differential (at a standard or non-standard frequency) can follow the shape of a square wave, a triangle wave, etc. Alternatively, if controller M1" is configured to detect arc faults, a current differential having characteristics of an arc fault can be generated (e.g., having shouldering, current spikes, etc.), thereby testing the ability of the controller to detect arc faults. Such characteristics and devices for detecting them are described e.g., in US 2020/0127452, the entirety of which is incorporated by reference.

The function generator can be any function suitable for generating one of the current differential signals on the third conductor as described above. In the example shown in FIG. 7A-7C, the function generator is implemented as an output from controller M1" itself or from another integrated circuit. For example, M1" can provide a digital output to a digital to analog converter and amplifier for voltage and/or current gain. The resulting output can be a signal of any desired shape and frequency, as limited by the maximum bit rate of the digital output of M1" and the rate of the digital to analog converter. In another example, a comparator can be used to amplify a digital output (i.e., the comparator goes HIGH each time the digital output is HIGH), the amplified digital output forming the drive signal to the third conductor. In another example, the digital output of controller M1" can input to the third conductor directly (e.g., the TEST output from pin 21), the values of the resistance (e.g., R3 and R4) being set to create the desired fault current.

In alternative examples, various circuits, external to controller M1", can be used. For example, a 555 timer integrated circuit or a multivibrator integrated circuit can be used to form a drive signal that can be input to the third conductor. Alternatively, a programmable waveform generator, such as Analog Device Integrated Circuit AD9833 can employed. However, it should be understood that these are merely provided as examples and any suitable circuit can be used to generate the drive signal.

Furthermore, although providing a standard or nonstandard drive signal to the third conductor 120, to form a differential current in the third conductor 120 with respect to the neutral conductor, is described in conjunction with FIG. 7A-7C, it can be implemented in conjunction with electrical wiring device 100 of FIG. 1A-1B or any other suitable electrical wiring device in alternative examples. Indeed, in various alternative examples, the differential current can be detected by any suitable protective circuit assembly configured to trigger a trip mechanism to electrically decouple the line side and load side terminals. Such suitable protective circuit assemblies include controllers such as controller M1, M1', and M1" as well as GFI circuits such as an FAN4141 or FAN4149.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto; inventive embodiments may be practiced otherwise than as specifically described and claimed.

All references, including publications, patent applications, and patents, cited herein are hereby incorporated by reference to the same extent as if each reference were individually and specifically indicated to be incorporated by reference and were set forth in its entirety herein.

All definitions, as defined and used herein, should be understood to control over dictionary definitions, definitions in documents incorporated by reference, and/or ordinary meanings of the defined terms.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An electrical wiring device comprising:
   a plurality of line terminals comprising a line-side phase terminal and a line-side neutral terminal;
   a plurality of load terminals comprising a load-side phase terminal and a load-side neutral terminal;
   a line conductor electrically coupling the line-side phase terminal to the load-side phase terminal;
   a neutral conductor electrically coupling the line-side neutral terminal to the load-side neutral terminal; and
   a controller configured to trigger a trip mechanism to electrically decouple the at least one of the plurality of line terminals from at least one of the plurality of load terminals based, at least in part, on comparing a magnitude of a current differential to a threshold, wherein the current differential represents a difference in current between the line conductor and the neutral conductor, wherein the threshold is a function of a frequency of the current differential, wherein the threshold is retrieved from a plurality of stored thresholds according to a frequency value of the differential current, each of the stored thresholds being respectively associated with a range of frequency values of the differential current.

2. The electrical wiring device of claim 1, wherein the controller is further configured to determine a frequency value of the differential current.

3. The electrical wiring device of claim 2, wherein the controller determines the frequency value of the differential current according to a number of instances the current differential exceeds a frequency value over a predetermined period of time.

4. The electrical wiring device of claim 1, wherein the controller receives a voltage signal representative of the magnitude of the current differential, wherein the controller compares the magnitude of the current differential to the threshold by comparing the voltage signal representative of the magnitude of the current differential to the threshold.

5. The electrical wiring device of claim 4, wherein the voltage signal, received by the controller, is generated by a differential transformer through which the line conductor and the neutral conductor extend.

6. The electrical wiring device of claim 4, wherein the voltage signal is amplified by an amplifier.

7. The electrical wiring device of claim 5, wherein the voltage signal is further filtered by a low pass filter.

8. The electrical wiring device of claim 4, wherein the voltage signal is amplified and filtered by a transimpedance amplifier.

9. The electrical wiring device of claim 1, wherein the controller comprises a comparator, the comparator comparing a magnitude of the differential current to a threshold, wherein the threshold is a smoothed pulse width modulated signal, a pulse width of the pulse width modulated being determined according to a frequency value of the current differential.

10. The electrical wiring device of claim 9, wherein the pulse width modulated signal is smoothed with a smoothing capacitor.

11. The electrical wiring device of claim 9, wherein the controller is further configured to generate the pulse width modulated signal.

12. The electrical wiring device of claim 1, further comprising a controller integrity detection circuit configured to trigger the trip mechanism if an input signal is not received from the controller within a predetermined period of time.

13. The electrical wiring device of claim 1, further comprising a function generator configured to provide a drive signal to a third conductor, wherein at least the neutral conductor and the third conductor extend through a differential transformer, wherein the drive signal creates a differential current in the third conductor with respect to the neutral conductor.

14. An electrical wiring device, comprising:
a plurality of line terminals comprising a line-side phase terminal and a line-side neutral terminal;
a plurality of load terminals comprising a load-side phase terminal and a load-side neutral terminal;
a line conductor electrically coupling the line-side phase terminal to the load-side phase terminal;
a neutral conductor electrically coupling the line-side neutral terminal to the load-side neutral terminal; and
a controller configured to trigger a trip mechanism to electrically decouple the at least one of the plurality of line terminals from at least one of the plurality of load terminals based, at least in part, on comparing a magnitude of a current differential between the line conductor and the neutral conductor to a threshold,
a controller integrity detection circuit configured to trigger the trip mechanism if an input signal is not received from the controller within a predetermined period of time, wherein the controller is configured to perform at least one test prior to outputting the input signal to the controller integrity detection circuit, wherein the at least one test includes a test of at least one of a hardware, a firmware, or a software of the controller.

15. The electrical wiring device of claim 13, wherein the at least one test comprises a grounded neutral test.

16. The electrical wiring device of claim 14, wherein the integrity detection circuit comprises an inverter and a capacitor, the capacitor being connected across the input of the inverter, wherein the input signal charges the capacitor such that the output of the inverter to the trip mechanism is LOW.

17. The electrical wiring device of claim 16, further comprising a second capacitor connected in series with the input of the inverter.

18. An electrical wiring device, comprising:
a plurality of line terminals comprising a line-side phase terminal and a line-side neutral terminal;
a plurality of load terminals comprising a load-side phase terminal and a load-side neutral terminal;
a line conductor electrically coupling the line-side phase terminal to the load-side phase terminal;
a neutral conductor electrically coupling the line-side neutral terminal to the load-side neutral terminal; and
a third conductor;
a differential transformer, wherein at least the neutral conductor and the third conductor extend through an inner diameter of the differential transformer;
a function generator configured to provide a drive signal to the third conductor, wherein the drive signal creates a differential current in the third conductor with respect to the neutral conductor, wherein the differential transformer is configured to generate a voltage signal representative of the differential current;
a protective circuit assembly coupled to the differential transformer, the protective circuit assembly being configured to trigger a trip mechanism to electrically decouple at least one of the plurality of line terminals from at least one of the plurality of load terminals when the voltage signal substantially corresponds to at least one predetermined fault criterion, wherein the drive signal is configured to create the differential current in a manner that matches at least one of the at least one predetermined fault criterion.

19. The electrical wiring device of claim 18, wherein the differential current, created by the drive signal, is of a frequency other than a frequency of a mains signal received at the plurality of line terminals.

20. The electrical wiring device of claim 18, wherein the differential current, created by the drive signal, comprises a non-sinusoidal shape.

21. The electrical wiring device of claim 18, wherein the drive signal is swept over a range of frequencies, an upper bound of the range of frequencies exceeding 60 Hz.

22. The electrical wiring device of claim 21, wherein the protective circuit assembly comprises a controller configured to trigger the trip mechanism to electrically decouple the at least one of the plurality of line terminals from at least one of the plurality of load terminals based, at least in part, on comparing a magnitude of the current differential to a threshold, wherein the threshold is a function of the frequency of the current differential.

23. The electrical wiring device of claim 18, wherein the protective circuit assembly comprises a ground fault circuit interrupt controller.

24. The electrical wiring device of claim 18, wherein the third conductor includes at least one resistor, the application of the drive signal to the at least one resistor creating the differential current.

* * * * *